United States Patent [19]
Hohne et al.

[11] Patent Number: 5,491,988
[45] Date of Patent: Feb. 20, 1996

[54] WARP-KNITTING MACHINE WITH AT LEAST ONE GUIDE BAR

[75] Inventors: Hans-Jurgen Hohne, Hainburg; Kresimir Mista, Heusenstamm, both of Germany

[73] Assignee: Karl Mayer Textilmaschinenfabrik GmbH, Obertshausen, Germany

[21] Appl. No.: 332,251

[22] Filed: Oct. 31, 1994

[30] Foreign Application Priority Data

Nov. 2, 1993 [DE] Germany .............. 43 37 265.1

[51] Int. Cl.⁶ .................................................. D04B 27/32
[52] U.S. Cl. ........................................................ 66/204
[58] Field of Search ........................... 66/204, 207, 87; 310/330, 331

[56] References Cited

U.S. PATENT DOCUMENTS

| | | | |
|---|---|---|---|
| 3,144,522 | 8/1964 | Bernstein | 310/330 X |
| 3,297,889 | 1/1967 | Breskend | 310/330 X |
| 3,712,962 | 1/1973 | Epley | 310/330 X |
| 4,099,211 | 7/1978 | Hathaway . | |
| 4,565,940 | 1/1986 | Hubbard, Jr. | 310/330 X |
| 4,786,837 | 11/1988 | Kalnin et al. | 310/330 X |
| 4,988,908 | 1/1991 | Langton | 310/331 |
| 5,034,649 | 7/1991 | Chida et al. | 310/332 |

FOREIGN PATENT DOCUMENTS 4226899 1/1994 Germany .

*Primary Examiner*—John J. Calvert
*Attorney, Agent, or Firm*—Omri M. Behr; Matthew J. McDonald

[57] ABSTRACT

In a warp-knitting machine with jacquard control, guide needles (1) are fastened to a guide bar (6) by means of carrier strips (3) which are bendable by at least one piezoelectric bending transducer. Each carrier strip (3) consists of electrically insulating material. The strip carries on at least one side, a layering consisting of (a) an inner electrode (8 to 11), (b) a piezoelectrically active layer (15, 17) covering the latter and (c) an outer electrode (16, 18). A control circuit (29) selectively supplies the inner electrode (8 to 11) with control voltage, while the outer electrode (16, 18) is connected to a reference potential. A contact-protected Jacquard control operated piezoelectrically is obtained in this way.

16 Claims, 1 Drawing Sheet

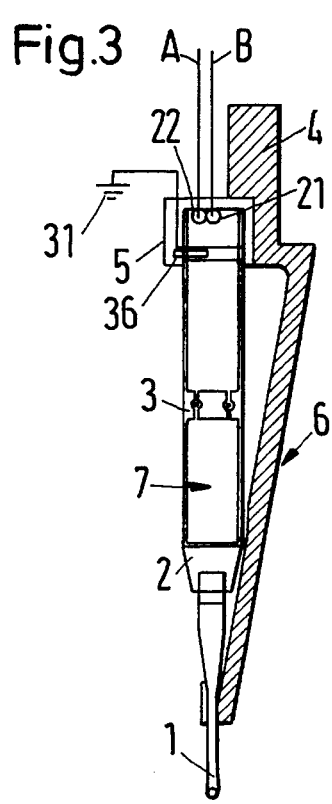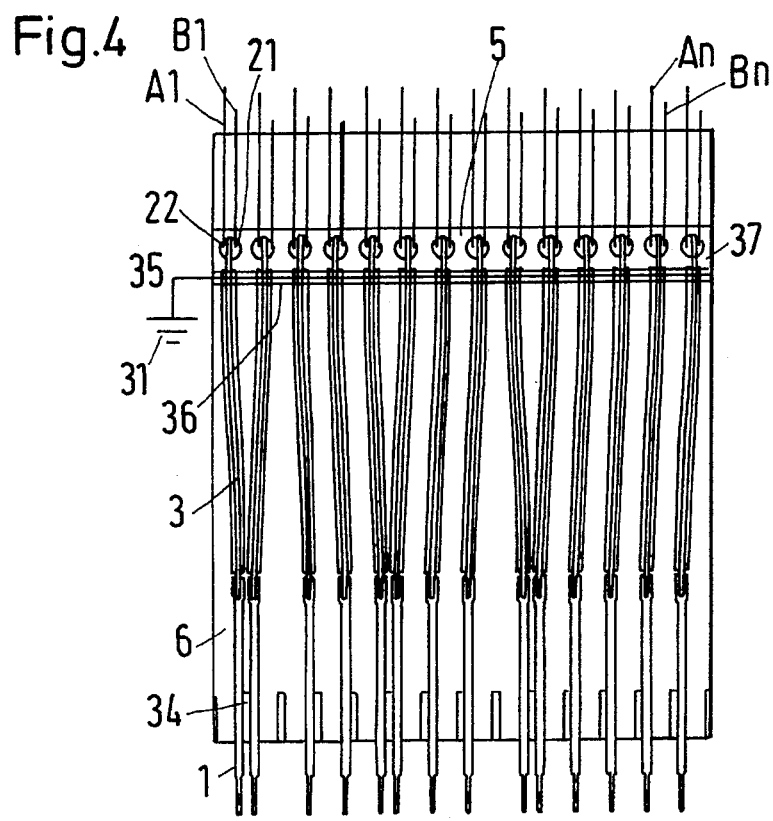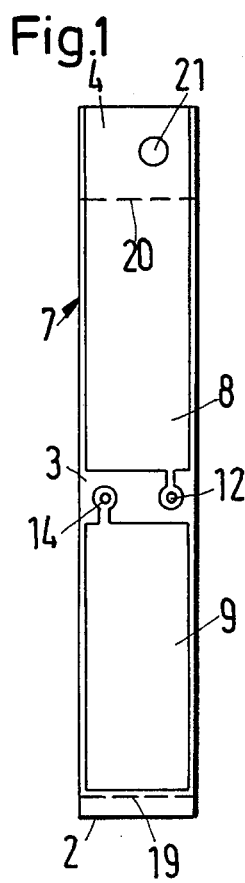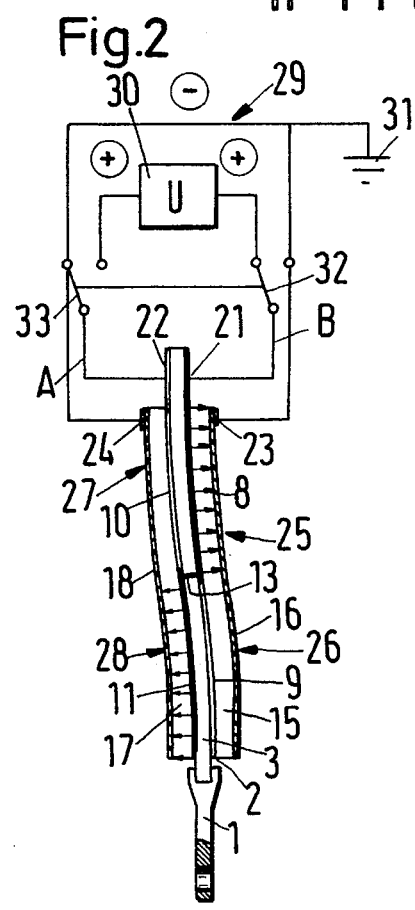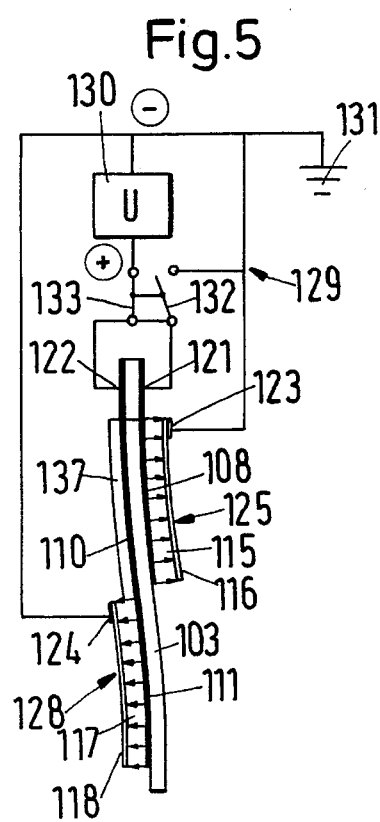

5,491,988

WARP-KNITTING MACHINE WITH AT LEAST ONE GUIDE BAR

BACKGROUND OF THE INVENTION

1. Field of the Invention

The invention relates to a warp-knitting machine with at least one guide bar, the guide of which can be offset by the amount of at least one needle spacing by means of a jacquard control.

2. Description of Related Art

An older, not previously published Patent Application P 43 16 396.3-26 of the Applicant discloses that the guides can be fastened to the guide bar, with a carrier strip bendable by at least one piezoelectric bending transducer, being interposed in each case. Provision is also made, here, for two piezoelectric bending transducers to be mechanically coupled in series and, when activated jointly, to bring about an oppositely directed bending. The carrier strip consists of electrically conductive material to form an inner (first) electrode. The piezoelectrically active layers are covered with an outer (second) Junction electrode. A control circuit provides a positive and a negative potential for supplying the electrodes.

An object of the present invention is designing a warp-knitting machine with an operationally reliable jacquard control for the guide, which requires little space.

SUMMARY OF THE INVENTION

In accordance with the illustrative embodiments demonstrating features and advantages of the present invention, there is provided a warp knitting machine having a Jacquard control having at least one guide bar and a plurality of guides. This warp knitting machine has a plurality of carrier strips, each having an electrically insulating material and each being fastened between the guide bar and a corresponding one of the guides. A plurality of piezoelectric bending transducers are separately mounted, at least one each, on corresponding ones of the carrier strips. Each of these bending transducers have a layering separately mounted on at least one side of the electrically insulating material of the carrier strips. The layering includes (a) a first electrode, (b) an second electrode adapted to be connected to a reference potential, and (c) a piezoelectrically active layer mounted between the first electrode and the second electrode. The warp knitting machine also has a control circuit for selectively supplying the first electrode with a control voltage for deflecting the layering to offset the guides by the amount of at least one needle spacing.

The use of the piezoelectric bending transducers makes it possible to reduce the space requirements for the jacquard control very considerably in comparison with the mechanically actuated jacquard controls. The jacquard device is protected against contact, because the outer (second) electrode is connected to a reference potential (e.g., ground). Additional protection is achieved because the inner electrode carrying the control voltage rests on the insulating material of the carrier strip and is covered by the piezoelectrically active layer. This is not only advantageous for reasons of operating reliability, but it also allows the use of higher control voltages, for example above 48 V. This in turn makes it possible to achieve relatively large offsetting movements of the guide and/or to reduce the size of the jacquard device and/or to achieve higher actuating forces. A further advantage is that the guides can be fastened directly to the insulating material of the carrier strip.

Advantageously, the inner electrode is applied as a copper layer to the carrier strip. All known techniques can be used for this purpose; for example, a coating which is customary in electrical printed circuit boards.

Preferably, the edges of the inner electrode are covered completely by the piezoelectrically active layer. A very high degree of contact protection is therefore obtained.

In the preferred embodiment, only one electrode portion, located at the clamping end of the carrier strip, is left free to act as the junction of a control line. There, the Junction points are subjected to the least mechanical load. A reliable electrically insulating covering is also employed there, for example, by encapsulating the junction region with an electrically insulating material, such as epoxy resin.

In the preferred embodiment, an S-shaped bending of the carrier strip is obtained. The guide is therefore displaced parallel to itself. This principle can also be used for deflection on both sides. Also, manufacturing is facilitated by providing on both sides a continuous outer electrode and a continuous, piezoelectrically active layer.

Preferably, the inner electrodes are segmented and connected to an opposing side of the carrier strip with a contact-protected junction.

Also the preferred embodiment employs a comb according that makes it possible to connect all the outer electrodes in a simple way to a reference potential such as ground.

BRIEF DESCRIPTION OF THE DRAWINGS

The invention is explained in more detail below by means of the preferred, exemplary embodiments illustrated in the drawings; wherein:

FIG. 1 shows a side view of a carrier strip used according to the principles of the present invention, FIG. 2 shows a diagrammatic edge view of a first embodiment of a guide adjustable by means of bending transducers, with an associated control circuit, FIG. 3 shows in cross-section, an exemplary installation of the foregoing carrier strip, FIG. 4 shows a plurality of the assemblies of FIG. 3 installed together, and FIG. 5 shows an embodiment that is an alternate to that of FIG. 2.

DETAILED DESCRIPTION OF THE PREFERRED EMBODIMENTS

In all the exemplary embodiments, guides 1 are fastened to the lower end 2 of a flexible carrier strip 3, which is fastened with its upper end region 4 to a guide bar 6 by means of a holding device 5.

The carrier strip 3 consists of electrically insulating material, for example of glass-fiber-reinforced plastic, such as polyamide or epoxy resin. It carries on both sides a copper coating 7 which can be applied by any technique; for example, in a way similar to printed circuit boards. The coating 7 forms on each side two pairs of inner (first) electrodes 8, 9 and 10, 11 which, when located on the same side, are respectively offset relative to one another in the strip (longitudinal) direction. The electrode 8 has an extension 12 which is electrically connected via a hole 13 in the carrier strip 3 to the diagonally opposite inner electrode 11. The inner electrode 9 is connected electrically in a similar way to the diagonally opposite inner electrode 10, via an extension 14.

The inner electrodes 8 and 9 are covered by a continuous, piezoelectrically (or electrostatically) active layer 15. Layer 15 leaves free only the end regions 2 and 4 and is provided with a likewise continuous outer (second) electrode 16; for example, a graphite coating. The inner (first) electrodes 10 and 11 are covered in the same way by a continuous, piezoelectrically active layer 17 which is provided with a continuous outer (second) electrode 18. These layers extend between the broken lines 19 and 20, so that the inner electrode 9 is covered completely and the inner electrode 8 is covered with the exception of the upper end region having a junction 21 (or, on the other side, with the exception of the upper end region having a junction 22).

Since the copper coating 7 does not reach completely up to the edge of the carrier strip 3, the inner electrodes 8 to 11 (with the exception of the upper end region 4) are covered completely by the active layer 15 and 17, respectively. The outer electrodes 16 and 18 are connected by means of contacts 23 and 24.

This therefore results altogether in four layerings 25, 26, 27 and 28, which each correspond to a bending transducer, and which are defined by the shape of the inner electrodes 8 to 11.

FIG. 2 shows a control means, namely a circuit 29 having a voltage source 30. One output is connected to a reference potential (i.e., ground 31) and to junctions 23 and 24. Double pole, double throw switches 32, 33 have their swinging contact arms connected via lines B and A to contacts 21 and 22, respectively. The other two outputs of control means 30 each carry a control voltage and are separately connected to alternate ones of the selectable contacts of switches 32 and 33. Thus, the control voltage can be selectively and alternately applied via the switches 32 and 33 by way of the line A or B, so that one of the Junctions 21 and 22 receives a control voltage, while the other junction is grounded.

With the illustrated switch positions, the piezoelectrically active layers 15 and 17 in the layerings 25 and 28 are active, because control voltage supplied at the junction 21 provides a field across the piezoelectric material with respect to the grounded outer electrodes 16 and 18. An S-shaped bending of the carrier strip 3 together with a corresponding offset of the guide 1 occurs. Alternatively, layerings 26 and 27 can be activated by reversing switches 32 and 33, and a Z-shaped bending occurs moving guide 1 to the left.

FIGS. 3 and 4 show that the junctions 21 and 22 of each carrier strip are connected to associated control lines A1–An, and B1–Bn, respectively. Each of the guides 1 can be adjusted independently in this way. The two extreme positions of the guides are determined by stops 34 on the guide bar 6.

After connecting the junctions of the control lines A and B and after fastening the carriers 3 to guide bar 6, the entire portion 5 is encapsulated with electrically insulating plastic 37, such as epoxy resin, so that all parts carrying control voltage are arranged with contact protection. The plastic 37 can form a block 35 which serves as a holding device 5, in that it is adhesively bonded or otherwise fastened to the guide bar 6 or is cast in situ. Also provided is a grounded, comb-like structure 36, which contacts the junctions 23 and 24 of the outer electrodes 16 and 18, so that these are maintained at a reference potential, and can serve as a fixing aid during assembly.

In the embodiment according to FIG. 5, corresponding components have similar reference symbols, but incremented by 100. The essential differences are that only the layerings 125 and 128 are present, and the inner electrode 108 is not connected to the inner electrode 111. On the contrary, electrode 111 is connected to the junction 122 via a connecting line 110, which is covered by an electrically insulating layer 137. Also, the two junctions 121 and 122 can be selectively connected simultaneously to the control voltage or to ground 131. In this embodiment, the carrier strip assumes either the illustrated S-shaped bend, or an extended, relatively straight position.

Deviations from the embodiments illustrated can be made in many respects, without departing from the basic idea of the invention. For example, in FIG. 2, instead of the continuous, piezoelectrically active layers 15 and 17, each of the layerings 25–27 can have its own, separate, active layer, in which case their outer electrodes must be connected by separate means. As piezoelectric material, all the materials which can be used for this purpose come into consideration, especially piezoceramic. In the embodiment of FIG. 5, the bending direction can also be reversed by applying a negative control voltage.

In the simplest instance, the carrier strip carries only one layering 25. The term "grounded" is to mean that the voltage effective there is low in relation to the environment. There is no need for an absolute zero setting.

We claim:

1. A warp knitting machine having a jacquard control comprising:

at least one guide bar;

a plurality of guides;

a plurality of carrier strips each having an electrically insulating material and each being fastened between said guide bar and a corresponding one of said guides;

a plurality of piezoelectric bending transducers being separately mounted, at least one each, on corresponding ones of said carrier strips, each of said bending transducers having a layering separately mounted on at least one side of said electrically insulating material of said carrier strips, said layering including:

(a) a first electrode, (b) an second electrode adapted to be connected to a reference potential, and (c) a piezoelectrically active layer mounted between said first electrode and said second electrode; and a control circuit for selectively supplying said first electrode with a control voltage for deflecting said layering to offset said guides by the amount of at least one needle spacing.

2. Warp knitting machine according to claim 1 wherein said first electrode is mounted to the inside of said piezoelectrically active layer.

3. Warp knitting machine according to claim 2, wherein the first electrode comprises a copper layer affixed to said carrier strip.

4. Warp knitting machine according to claim 2, wherein the first electrode leaves uncovered, edge regions of the carrier strips, the uncovered edge regions being covered by the piezoelectrically active layer.

5. Warp knitting machine according to claim 1, wherein said control means has a control line and wherein the carrier strip has (a) a remote end that is remote from said guide, and (b) a proximal end that is proximal to said guide, said first electrode projecting at the remote end beyond the piezoelectrically active layer, a said first electrode having at said remote end a junction located beyond the piezoelectrically active layer and adapted to connect to the control line.

6. Warp knitting machine according to claim 2, wherein said control means has a control line and wherein the carrier strip has (a) a remote end that is remote from said guide, and (b) a proximal end that is proximal to said guide, said first electrode projecting at the remote end beyond the piezoelectrically active layer, said first electrode having at said remote end a junction located beyond the piezoelectrically active layer and adapted to connect to the control line.

7. Warp knitting machine according to claim 6 comprising an electrically insulating covering mounted over that portion of said first electrode projecting at the end of the carrier strip remote from the guide.

8. Warp knitting machine according to claim 1, wherein the layering of said carrier strip comprises:

a first layering portion attached to one side of said carrier strip; and a second layering portion attached to the opposite side of said carrier strip, said first and said second layering portions being longitudinally offset and electrically connected.

9. Warp knitting machine according to claim 2, wherein the layering of said carrier strip comprises:

a first layering portion attached to one side of said carrier strip; and a second layering portion attached to the opposite side of said carrier strip, said first and said second layering portions being longitudinally offset and electrically connected.

10. Warp knitting machine according to claim 4, wherein the layering of said carrier strip comprises:

a first layering portion attached to one side of said carrier strip; and a second layering portion attached to the opposite side of said carrier strip, said first and said second layering portions being longitudinally offset and electrically connected.

11. Warp knitting machine according to claim 8, wherein the layering of said carrier strip comprises:

a third layering portion opposite the first layering portion and a fourth layering portion opposite the second layering portion, the first electrode of the third and fourth layering portion being connected together, the control circuit being operable to selectively supply control voltage to the first electrode of either the first or the third layering portion.

12. Warp knitting machine according to claim 11, wherein the piezoelectrically active layers and the second electrodes of the third and second layering portions are continuous and wherein the piezoelectrically active layers and the second electrodes of the first and fourth layering portions are continuous.

13. Warp knitting machine according to claim 11, wherein the first electrodes of the first and second layering portions are connected together through the carrier strip, and wherein the first electrodes of the third and fourth layering portions are connected together through the carrier strip.

14. Warp knitting machine according to claim 12, wherein the first electrodes of the first and second layering portions are connected together through the carrier strip, and wherein the first electrodes of the third and fourth layering portions are connected together through the carrier strip.

15. Warp knitting machine according to claim 1, comprising:

a comb-like structure adapted to be connected to a reference potential and extending along the guide bar for contacting the second electrodes.

16. Warp knitting machine according to claim 14, comprising:

a comb-like structure adapted to be connected to a reference potential and extending along the guide bar for contacting the second electrodes.

* * * * *